(12) United States Patent
Jang (10) Patent No.: US 8,492,013 B2
(45) Date of Patent: Jul. 23, 2013

(54) PROTECTION CIRCUIT BOARD FOR SECONDARY BATTERY AND SECONDARY BATTERY USING THE SAME

(75) Inventor: Youngcheol Jang, Yongin-si (KR)

(73) Assignee: Samsung SDI Co., Ltd., Gongse-dong, Giheung-gu, Yongin-si, Gyeonggi-do (KR)

( * ) Notice: Subject to any disclaimer, the term of this patent is extended or adjusted under 35 U.S.C. 154(b) by 158 days.

(21) Appl. No.: 13/009,398

(22) Filed: Jan. 19, 2011

(65) Prior Publication Data

US 2011/0111265 A1 May 12, 2011

Related U.S. Application Data

(62) Division of application No. 12/010,556, filed on Jan. 25, 2008, now Pat. No. 7,898,814.

(30) Foreign Application Priority Data

Mar. 15, 2007 (KR) .......................... 10-2007-0025643

(51) Int. Cl.
*H01M 10/48* (2006.01)
(52) U.S. Cl.
USPC .............................................. 429/7; 361/748
(58) Field of Classification Search
USPC .............................................. 429/7; 361/748
See application file for complete search history.

(56) References Cited

U.S. PATENT DOCUMENTS

| 4,503,131 | A | 3/1985 | Baudrand |
| 5,197,889 | A | 3/1993 | Rizzo et al. |
| 2003/0180582 | A1* | 9/2003 | Masumoto et al. ............... 429/7 |
| 2004/0096732 | A1* | 5/2004 | Shin et al. ........................ 429/61 |
| 2004/0137299 | A1* | 7/2004 | Mazza et al. .................... 429/34 |
| 2005/0153172 | A1 | 7/2005 | Han |
| 2005/0221130 | A1 | 10/2005 | Yoon |
| 2006/0227521 | A1* | 10/2006 | Nam et al. .................... 361/780 |
| 2006/0257723 | A1 | 11/2006 | Tan et al. |

FOREIGN PATENT DOCUMENTS

| CN | 200510002023 | | 7/2005 |
| JP | 07268640 | | 10/1995 |
| JP | 07268640 A | * | 10/1995 |
| JP | 2001268808 | | 9/2001 |
| KR | 1020050103521 | * | 1/2006 |
| KR | 100639410 | | 10/2006 |
| KR | 100649657 | | 11/2006 |
| WO | 01-97583 | | 12/2001 |
| WO | 2007004660 | | 1/2007 |

* cited by examiner

*Primary Examiner* — Milton I Cano
*Assistant Examiner* — Brent Thomas
(74) *Attorney, Agent, or Firm* — Robert E. Bushnell, Esq (57) ABSTRACT

A protection circuit board for a secondary battery is constructed with an electrically insulating substrate, a printed circuit board pattern formed on the electrically insulating substrate, a protection circuit part electrically connected to the printed circuit board pattern, a charge-and-discharge terminal formed on the electrically insulating substrate and electrically connected to the printed circuit board pattern and the protection circuit part, and a test terminal formed on the electrically insulating substrate and electrically connected to the printed circuit board pattern and the protection circuit part. The test terminal is constructed with an electroless plated layer formed on the test terminal.

10 Claims, 6 Drawing Sheets

PROTECTION CIRCUIT BOARD FOR SECONDARY BATTERY AND SECONDARY BATTERY USING THE SAME

CROSS-REFERENCE TO RELATED APPLICATIONS AND CLAIM OF PRIORITY

This application is a divisional of Applicants' Ser. No. 12/010,556, now U.S. Pat. No. 7,898,814, entitled PROTECTION CIRCUIT BOARD FOR SECONDARY BATTERY AND SECONDARY BATTERY USING THE SAME filed in the U.S. Patent & Trademark Office on 25 Jan. 2008 and assigned to the assignee of the above-captioned application. Furthermore, this application makes reference to, incorporates the same herein, and claims all benefits accruing under 35 U.S.C.§119, §120 and §121 from the aforesaid Applicant's Ser. No. 12/010,556, now U.S. Pat. No. 7,898,814, and from an application for PROTECTION CIRCUIT BOARD FOR SECONDARY BATTERY AND SECONDARY BATTERY USING THE SAME earlier filed in the Korean Intellectual Property Office on the $15^{th}$ day of Mar. 2007 and there duly assigned Ser. No. 10-2007-0025643.

BACKGROUND OF THE INVENTION

1. Field of the Invention

The present invention relates to a protection circuit board for a secondary battery. More specifically, the present invention relates to a test terminal formed on a protection circuit board used in a secondary battery.

2. Description of the Related Art

Portable electric/electronic devices, which have become more compact and lighter, such as cellular phones, notebook computers and camcorders are developed and produced. Thus, portable electric/electronic devices is usually provided with a battery pack so as to work in a place even where no power source is prepared. Considering the economic factor, the above battery pack recently adopts a chargeable/rechargeable secondary battery. Also, a secondary battery is expected to be applied in a hybrid car which requires high density energy and high power. It is now being studied, developed and produced.

A Ni—Cd battery, a battery, a Li battery and a Li-ion battery are representative secondary batteries.

Particularly, a Li-ion battery has an operating voltage of approximately 3 times higher than that of a Ni—Cd battery or a Ni-MH battery which are frequently used as portable electronic device power sources. Also, the Li-ion battery is widely used since the Li-ion battery has a high energy density per unit weight. The Li-ion battery usually employs a Li-based oxide as anode active material and a carbonic material as cathode active material. Generally, according to the kinds of electrolyte, secondary batteries are classified into liquid electrolyte batteries and high polymer electrolyte batteries. Batteries using a liquid electrolyte are named as Li-ion batteries while those using a high polymer electrolyte are named as Li-polymer batteries. Also, Li secondary batteries are being produced in various shapes. Representatively, there are cylinder-shaped, square-shaped and pouch-shaped batteries.

When the secondary batteries are charged or discharged, a voltage or a temperature, which is outputted from the secondary batteries, is measured. Since a protection circuit board, which administers the overall condition of the secondary batteries, is formed, it is possible to use the secondary batteries more stably. A printed circuit board pattern is formed on an electrically insulating substrate of the protection circuit board. A plurality of electric members and protection circuits are electrically connected to each other in the printed circuit board pattern. Also, on the protection circuit board, a charge-and-discharge terminal for charging/discharging a secondary battery and a test terminal for testing the normal operation state of the protection circuit board are electrically connected to the printed circuit board pattern. The charge-and-discharge terminal is not easily worn when it is connected to a battery connection terminal of a charger or an electronic appliance. In order to increase conductivity, the terminal surface is electrolytic plated. A connection part for the electrolytic plating is formed on the test terminal. A power source supplier for performing the electrolytic plating is connected to the connection part in order to apply a power source.

Since the contemporary connection part is formed on the periphery of a protection circuit board, however, static electricity tends to be introduced even after the electrolytic plating is finished. Also, since the connection part is electrically connected to a protection circuit, the static electricity, which has been introduced into the connection part, enters into the protection circuit. Due to the entrance of the static electrically, the internal integration circuit within the protection circuit is damaged.

In addition, when an electrolytic plating is performed on the contemporary test terminal or on the charge-and-discharge terminal, it takes approximately 8 hours. Due to this long process, the fabrication time of a protection circuit board is extended.

Furthermore, unlike the charge-and-discharge terminal, the surface of the contemporary test terminal has only a few numbers of contacts, so the use of an electrolytic plating method having superior hardness leads to an increase of fabrication costs.

Moreover, in addition to above problems, the color and luster of the test terminal, which is being exposed to the outside, should pursuit elegance for its graceful external appearance.

SUMMARY OF THE INVENTION

It is therefore an object of the present invention to provide an improved secondary battery with an improved protection circuit board.

It is another object of the present invention to prevent static electricity from being introduced through a connection part which is electrically connected to a test terminal formed on a protection circuit board for a secondary battery.

It is still another object of the present invention to shorten the fabrication time of a to protection circuit board.

It is yet still another object of the present invention to reduce fabrication costs of a protection circuit board.

It is a further object of the present invention to improve the elegance and luster of a test terminal.

According to one aspect of the present invention, a protection circuit board is constructed with an electrically insulating substrate, a printed circuit board pattern formed on the electrically insulating substrate, a protection circuit portion electrically connected to the printed circuit board pattern, a charge-and-discharge terminal which is formed on the electrically insulating substrate and electrically connected to the printed circuit board pattern and the protection circuit portion, and a test terminal which is formed on the electrically insulating substrate and electrically connected to the printed circuit board pattern and to the protection circuit portion. The test terminal is constructed with an electroless plated layer formed on the test terminal.

The electroless plated layer may be made from Au.

The electroless plated layer may be made from Ag.

The electroless plated layer may be made from Ni.

The electroless plated layer may be made from an alloy of Ni and P.

The protection circuit board may be further constructed with a second electroless plated layer formed on the upper surface of the electroless plated layer.

The second electroless plated layer may be made from gold.

The second electroless plated layer may be made from one selected from a group of Ni, Ag, and an alloy of Ni and P.

According to another aspect of the present invention, a secondary battery using a protection circuit board is constructed with an electrode assembly comprising an anode plate electrically connected to an anode tap, a cathode plate electrically connected to a cathode tap and a separator interposed between the anode plate and the cathode plate, a can receiving the electrode assembly, with one end part of the can being open, a cap assembly comprising an electrode terminal electrically connected to the cathode tap and a cap plate electrically connected to the anode tap, a lid electrode part electrically connected to the electrode terminal and the cap plate, a protection circuit board, and a resin molding part formed by molding the protection circuit board with a melting resin so as to expose the surface of the charge-and-discharge terminal. The protection circuit board is constructed with an electrically insulating substrate, a printed circuit board pattern formed on the electrically insulating substrate and electrically connected to the lid electrode part, a protection circuit part electrically connected to the printed circuit board pattern, a charge-and-discharge terminal formed on the electrically insulating substrate and electrically connected to the printed circuit board pattern and the protection circuit part, and a test terminal formed on the electrically insulating substrate and electrically connected to the printed circuit board pattern, with the test terminal comprising an electroless plated layer formed on the test terminal.

The resin molding part may be formed in such manner that the terminal surface of the test terminal is exposed.

The electroless plated layer may be made from Au.

The electroless plated layer may be made from Ag.

The electroless plated layer may be made from Ni.

The electroless plated layer may be made from an alloy of Ni and P.

The protection circuit board may be further constructed with a second electroless plated layer formed on the upper surface of the electroless plated layer.

The second electroless plated layer may be made from gold.

The second electroless plated layer may be made from one selected from a group of Ni, Ag, and an alloy of Ni and P.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Hereinafter, the embodiment according to the present invention will be explained in detail by referring to the accompanying drawings.

As used in this specification, a substrate is that single monolithic structure which exposes a major surface area upon which a circuit such as an integrated circuit device, is created by such techniques as deposition, etching and doping of one or more layers of electrical conductors, insulators, semiconductors and dielectric materials.

Figure 1A:
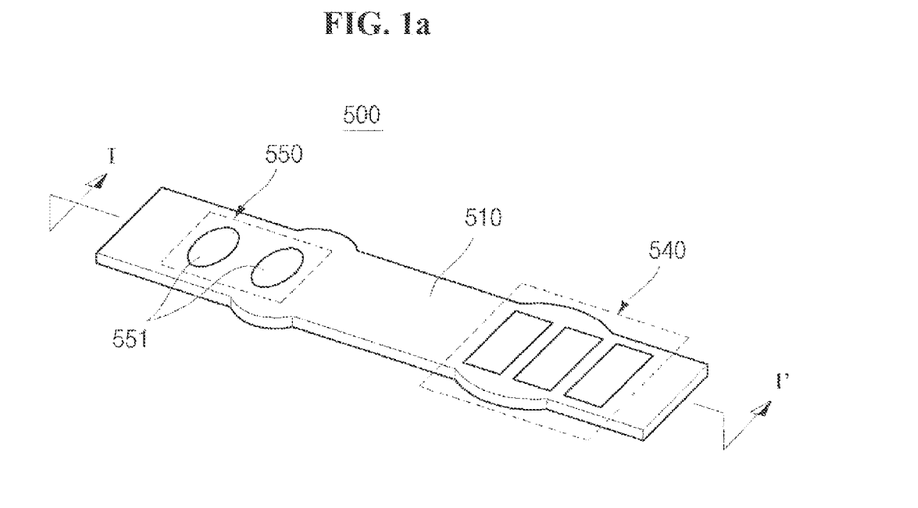
FIG. 1a is an oblique view of a protection circuit board constructed as an embodiment according to the principles of the present invention.
Figure 1B:
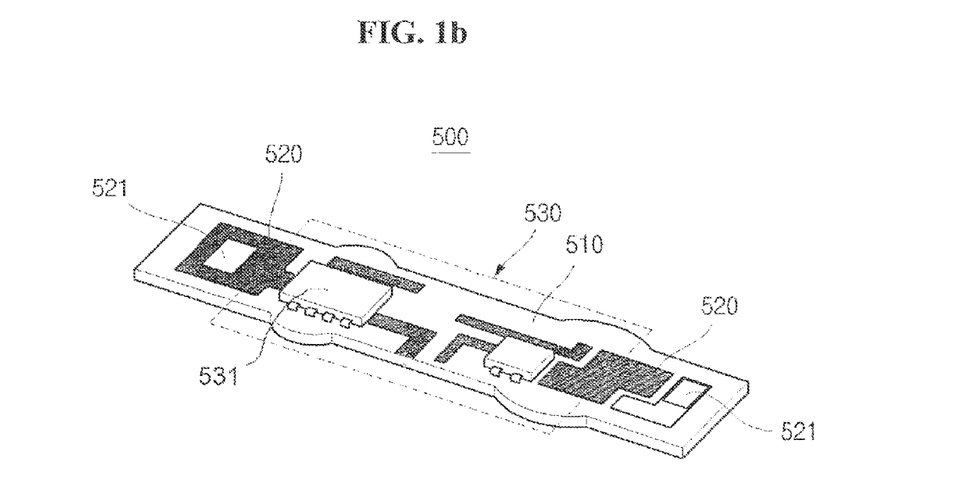
FIG. 1b is an oblique view of the protection circuit board of FIG. 1a in an upside-down position.

Referring to FIGS. 1a and 1b, a protection circuit board 500 for a secondary battery is constructed with an electrically insulating substrate 510, a printed circuit board pattern 520 formed on electrically insulating substrate 510, a protection circuit part 530 electrically connected to printed circuit board pattern 520, a charge-and-discharge terminal 540 formed on electrically insulating substrate 510 and electrically connected to printed circuit board pattern 520 and protection circuit part 530, and a test terminal 550 formed on electrically insulating substrate 510, electrically connected to protection circuit part 530 and including an electroless plated layer 551 on its upper surface.

Electrically insulating substrate 510 may be made from an epoxy or a bakelite resin, but no limitation thereof is made in the present invention. A plurality of electrically insulating substrates 510 can be deposited. Also, after printed circuit board pattern 520 or protection circuit part 530 is mounted, an insulation material may be coated to form a thin insulation film.

Printed circuit board pattern 520 can be formed by a conductive thin film mounted on an electrically insulating substrate. Printed circuit board pattern 520 is constructed with an electrode connection part 521 which is electrically connected to a secondary battery (not shown). Also, protection circuit part 530 including a plurality of electric members (not shown) and protection circuits 531 is electrically connected to charge-and-discharge terminal 540 as well as test terminal 550. Printed circuit board pattern 520 can be made from a plurality of deposited electrically insulating substrates.

Protection circuit part 530 may include a passive element (not shown) and an active element (not shown). Protection circuit 531 and can be electrically soldered on printed circuit board pattern 520.

A passive element may be a resistance or a condenser, and may be electrically connected to printed circuit board pattern 520 by a connection method such as soldering or the like. The passive element is electrically connected to protection circuit 531, functions as a filter for filtering signals, buffs a voltage and a current, or provides information such as a resistance value to a charger (not shown) or an external device (not shown).

An active element may be a diode electrically connected with a metal-oxide-semiconductor field-effect transistor (MOSFET) or a transistor (TR), which functions as an electrical switch for an external device (not shown). Also, the active element may be either a voltage element, or a current element or a temperature element for measuring the condition of a second battery. Alternatively, a voltage supply element for supplying a stable voltage to a protection circuit may be used. These active elements are integrated into an integrated circuit. A thermal fuse for breaking a current when a temperature increases excessively, a thermal breaker and a PTC safe element can be used selectively.

Protection circuit 531, which is electrically connected to a passive element and an active element, manages the overall condition of the secondary battery, checks the residual energy of the secondary battery, charges or discharges the battery with a proper charging method, and stores information such as voltage, current, temperature and battery residual energy regarding the condition of a secondary battery in order to send the information by communicating with an external appliance.

Charge-and-discharge terminal 540 is electrically connected to printed circuit board pattern 520 of protection circuit board 500. Also, charge-and-discharge terminal 540 is electrically connected to a MOSFET or a TR which functions as a charging and discharging switch and charges and discharges a secondary battery (not shown) by protection circuit 531 having a charge-and-discharge management function. Herein, the terminal surface of charge-and-discharge terminal 540, which is connected to a charger (not shown) or electronic devices (not shown), is electrolyte plated with Au, Ag, Ni or an alloy thereof to form a plated layer. Since the terminal surface of charge-and-discharge terminal 540 frequently contacts a charger or a battery electrical connection part (not shown), the use of Au, Ag, Ni or an alloy thereof may increase the corrosion resistance, may extend the process time of the electrolyte plating, thus increasing the thickness of a terminal surface and increasing the abrasion resistance.

Test terminal 550 according to principles of the present invention is electrically connected to printed circuit board pattern 520 and protection circuit part 530, and detects the charge-and-discharge function and safe function of protection circuit part 530. Further referring to FIG. 2, test terminal 550 is formed as a conductive thin film made from cooper. An electroless plated layer 551 is formed on the terminal surface of test terminal 550. Electroless plated layer 551 is formed by electroless plating on the terminal surface of test terminal 550.

Figure 3A:
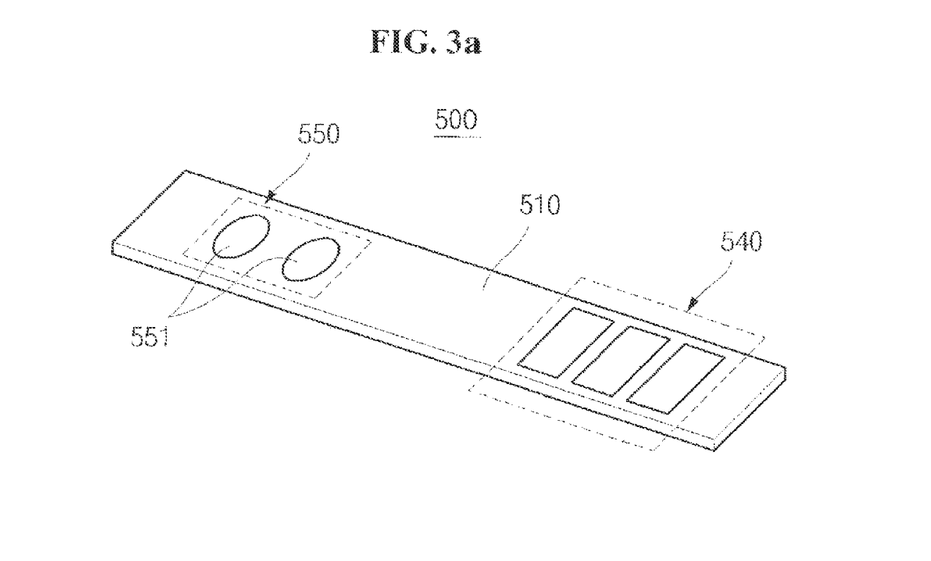
FIG. 3a is an oblique view of a protection circuit board as a comparative example.
Figure 3B:
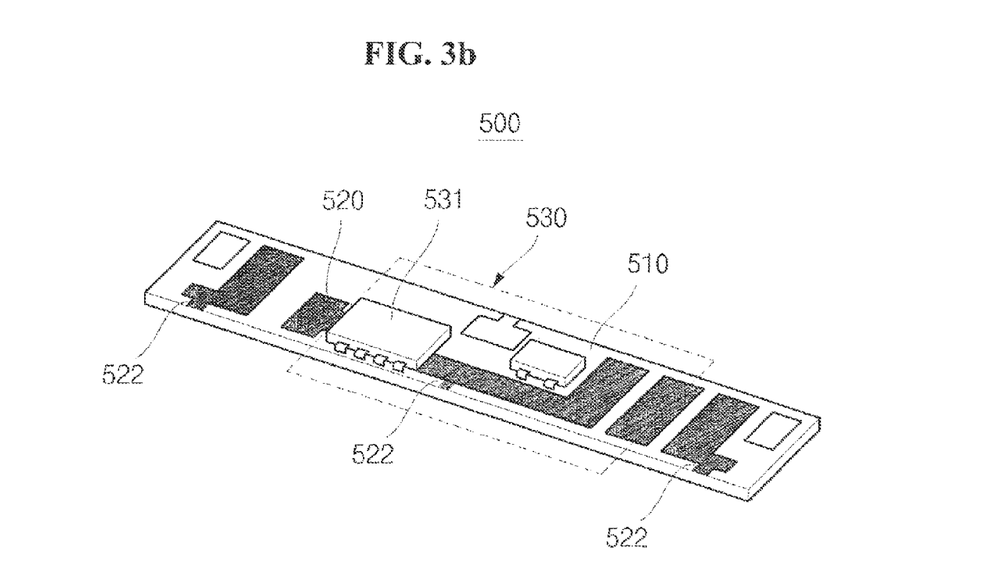
FIG. 3b is an oblique view of the protection circuit board of FIG. 3a in an upside-down position.

If a plated layer is formed on the terminal surface of test terminal 550 by using an electrolyte plating method, printed circuit board pattern 520 should be formed on the peripheral part of electrically insulating substrate 510. In the electrolyte plating method, referring to FIGS. 3a and 3b, printed circuit board pattern 520 is formed on the backside of protection circuit substrate 500, which is connected to charge-and-discharge terminal 540 or test terminal 550. Herein, an electrolyte plating contact part 522 is formed on test terminal 550, which is electrically connected to printed circuit board pattern 520, for electrolyte plating. After a power source is electrically connected to electrolyte plating contact part 522, a plating liquid comprising Ni, Au or an alloy thereof is coated and electrolyte plated. At this time, static electricity is easily introduced into electrolyte plating contact part 522, which damages protection circuit 531 electrically connected to electrolyte plating contact part 522. In contrast, as shown in FIG. 1a, if electroless plated layer 551 is formed by the electroless plating method, which is a chemical plating method, without electrolyte contact part 522 shown in FIG. 3b, the damage of protection circuit 531 with static electricity can be avoided.

Figure 2:
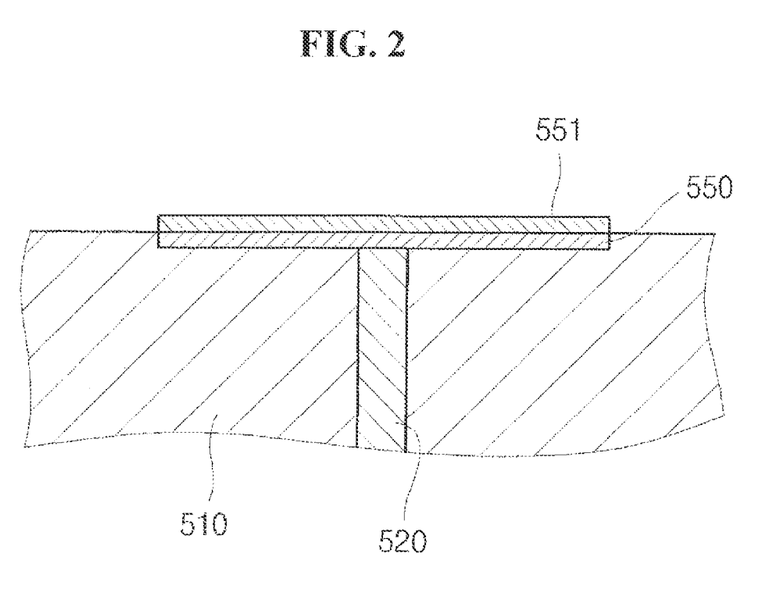
FIG. 2 is an enlarged cross-sectional view of a test terminal along line I-I' of FIG. 1a according to an embodiment of the principles of the present invention.

Referring to FIG. 2, an electroless plated layer 551 is made from Au or Ag. Since Au has an elegant color, Au improves the luster of a secondary battery. Also, Au has a superior conductivity. It is easy to distinguish the color of silver from that of Cu which is frequently used in the terminal of a circuit board. The color of Ag is also elegant.

Alternatively, electroless plated layer 551 may be made from Ni. In terms of hardness, Ni is relatively harder than Au or Ag. Also, according to the number of plating layers or content of the plating liquid, Ni may present an elegant luster.

Still alternatively, electroless plated layer 551 may be made from an alloy of Ni and P. If electroless plated layer 551 is formed in such a manner, the abrasion resistance and corrosion resistance may be improved in comparison to the case where only Ni is used.

Figure 4:
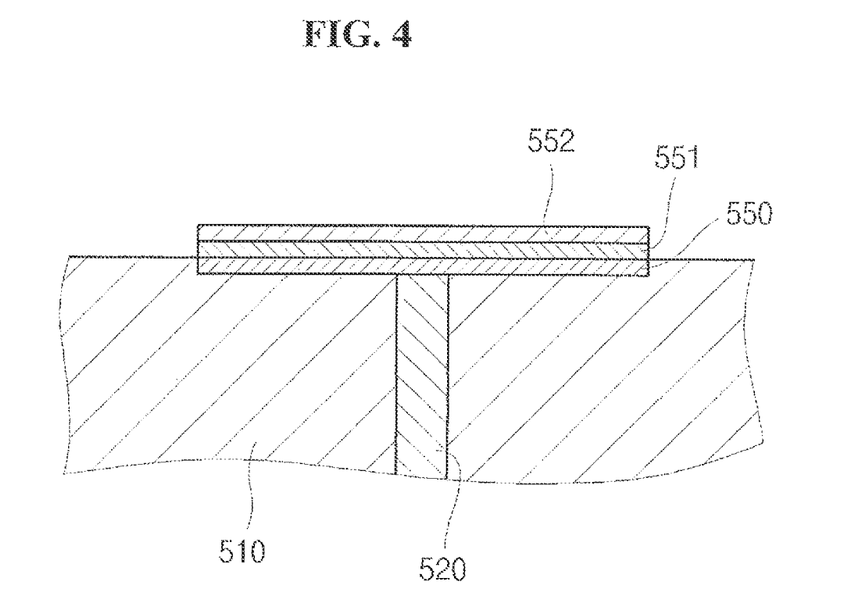
FIG. 4 is an enlarged cross-sectional view of a test terminal along line I-I' of FIG. 1a according to another embodiment of the principles of the present invention.

Referring to FIG. 4, a second electroless plated layer 552 may be further formed on the upper surface of electroless plated layer 551 in order to improve the abrasion resistance and corrosion resistance. Electroless plated layer 551 may be made from Ni, or an alloy of Ni and P or Au. At this time, the material of second electroless plated layer 552 should be an electrically conductive metal. In order to improve the binding force with electroless plated layer 551, second electroless plated layer 552 may be made from an alloy including the material of electroless plated layer 551.

Second electroless plated layer 552 may be made from Au. First of all, in order to increase the binding force, electroless plated layer 551 is formed on test terminal 550. Also, second electroless plated layer 552 made from Au is formed on the upper surface of electroless plated layer 510 so as to improve luster and add elegance to a secondary battery.

Alternatively, second electroless plated layer 552 may be made from any one from Ni, Ag and an alloy of Ni and P. Ag is easily distinguishable from Cu in terms of color and has elegant color. Ni has good binding force with electroless plated layer 551. Also, if an alloy of Ni and P is used, the abrasion resistance and corrosion resistance of second electroless plated layer 552 can be improved.

Figure 5:
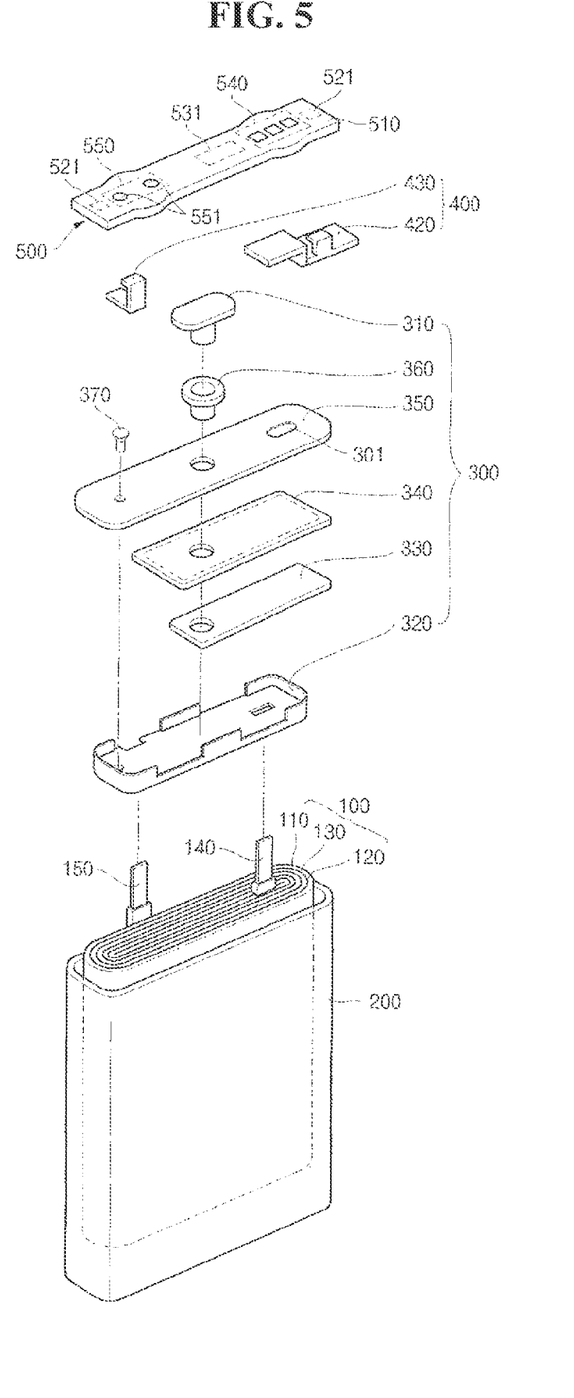
FIG. 5 is an exploded oblique view of a secondary battery constructed as an embodiment of the principles of the present invention, in which no resin molding part is formed.

Referring to FIG. 5, the secondary battery of the present invention using the above protection circuit board for a secondary battery may comprise an electrode assembly 100, a can 200, a cap assembly 300, a lid electrode part 400, a protection circuit board 500 and a resin molding part (not shown).

Electrode assembly 100 is formed in such a manner that an anode plate 110 electrically connected with an anode tap 150, a cathode plate 120 electrically connected with a cathode tap 140 and a separator 130 interposed between anode plate 110 and cathode plate 130 are deposited.

Anode plate 110 is constructed with an anode collector (not shown) and an anode active material layer (not shown). The anode active material layer may consist essentially of a lamellar compound comprising Li, a binder improving binding force and a conductive material improving conductivity. Generally, the anode collector is made from Al. Also, the anode collector provides a moving passage for electric charges generated from the anode active material layer and supports the anode active material layer. The anode active material layer is attached to wide surfaces of an anode collector, and an anode uncoated part (not shown) where no anode active material layer is formed is formed on one side of anode plate 110. Anode tap 150 is bound to the anode uncoated part.

A cathode plate 120 is constructed with a cathode collector (not shown) and a cathode active material (not shown). The cathode active material contains carbon and may be made from hard carbon, which is frequently used, or graphite, and a binder improving the binding force between active material particles. Generally, the cathode collector is made from Cu. Also, the cathode collector provides a moving passage for electric charges generated from the cathode active material layer and supports the cathode active material layer. The cathode active material layer is formed on the wide surface of a cathode plate 120. Herein, a cathode uncoated part (not shown), where no cathode active material layer is formed, is formed on one side of cathode plate 120. Cathode tap 140 is bound to the cathode uncoated part.

Separator 130, which is interposed between anode plate 110 and cathode plate 120, electrically insulates anode plate 110 from cathode plate 120 and passes electric charges of anode plate 110 and cathode plate 120. Generally, separator 130 may be made from polyethylene PE or polypropylene PP, but no limitation thereof is made in the present invention. Separator 130 may comprise an electrolyte and may be liquid or gel.

Both of anode tap 150 and cathode tap 140 electrically connect electrode assembly 510 to the electric terminal of an external device (not shown). Anode tap 150 and cathode tap 140 are respectively bound to the anode uncoated part of an anode plate 110 and the cathode uncoated part of a cathode plate 120. Generally, Al or Al alloy or Ni or Ni alloy may be used for both of anode tap 150 and cathode tap 140, but no limitation regarding the material thereof will be made in the present invention.

One end of can 200 is open to receive electrode assembly 100. Can 100 may be produced in a deep drawing method. Considering the shape of electrode assembly 510, can 100 is formed as a square or a track shape. After receiving electrode assembly 100, can 200 receives an electrolyte. Can 200, which has received electrode assembly 100, receives an insulation case 320 in the internal side, and then is sealed by welding or thermal bonding with a cap plate 350 of cap assembly 300. The material of can 200 is usually Al, but no limitation thereof will be made in the present invention.

Cap assembly 300 may be constructed with an electrode terminal 310 which is electrically connected to cathode tap 140, and a cap plate 350 which closes the opening part of a can and which is electrically connected to anode tap 150. More specifically, cap assembly 300 may be constructed with electrode terminal 310 which electrically connects cathode tap 140 of electrode assembly 100 to a cathode lid plate 420 and which is disposed in the center hole of cap plate 350 along with an insulation gasket 360, insulation case 320 which is disposed on the upper side of electrode assembly 100 received in can 200, a terminal plate 330 electrically connected with the end part of electrode terminal 310, an insulation plate 340 which insulates terminal plate 330 from cap plate 340 and has a center hole for connecting electrode terminal 310 to terminal plate 330, cap plate 350 having a hole for injecting an electrolyte, electrode terminal 310 and a safety vent 301 closing the opening part of can 200, insulation gasket 360 which encloses the body part of electrode terminal 310 to insulate cap plate 350 from electrode terminal 310, and an electrolyte injection hole tap 370 which seals the electrolyte injection hole of cap plate 350.

Figure 6:
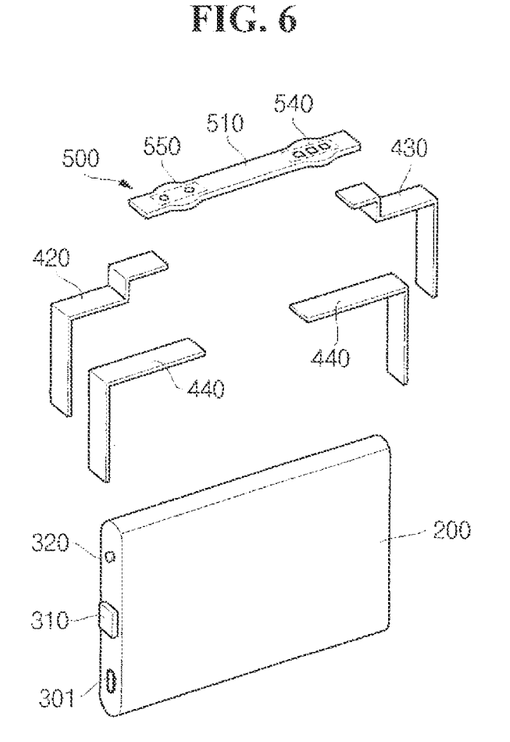
FIG. 6 is an exploded oblique view a secondary battery constructed as another embodiment of the principles of the present invention.

Lid electrode part 400 may be constructed with cathode lid electrode 420 electrically connected to electrode terminal 310, and an anode lid electrode 430 electrically connected to cap plate 350. Herein, cathode lid electrode 420 may be insulated by coating so as not to electrically contact cap plate 350. The other end parts of cathode lid electrode 420 and anode lid electrode 430 are electrically connected to electrode connection part 521 of protection circuit board 550. Herein, on electrode connection part 521, an anode lid tap (not shown) may be formed in order to easily attached to anode lid electrode 430 by means of supersonic welding or resistance welding. Also, a cathode lid tap (not shown) may be formed on electrode connection part 521 which is connected to cathode lid electrode 420. At this time, lid electrode part 400 is not confined to the configuration illustrated in the drawings. For example, referring to FIG. 6, a protection circuit board 500 may be formed at a lateral side can 200. As lid electrode part 400 is electrically connected to protection circuit board 500, cathode lid electrode 420 is electrically connected to electrode terminal 310 and anode lid electrode 430 is simultaneously connected to the bottom of can 200. Herein, an insulator 440 is interposed between lid electrode part 540 and can 200 so as to prevent a short circuit.

Turning back to FIG. 5, on protection circuit board 500, electrode connection part 521 is electrically connected to lid electrode part 400. Further description regarding protection circuit board 500 will be abbreviated since it is aforementioned.

Figure 7:
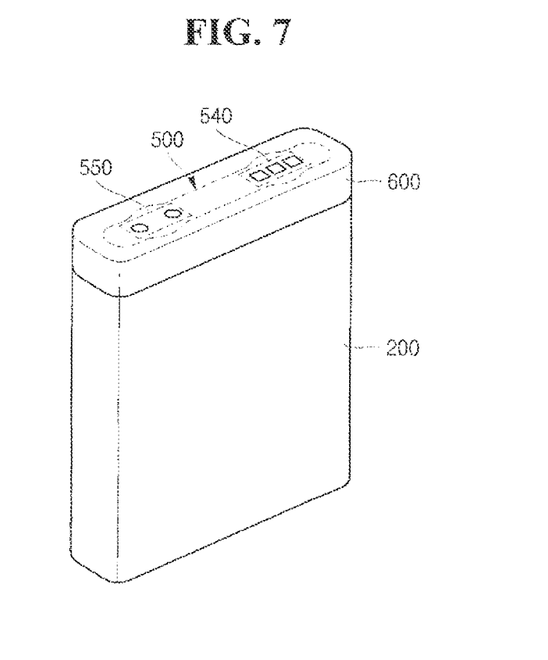
FIG. 7 is an oblique view of a secondary battery in which a resin molding part according to the embodiment of the present invention is formed.

Referring FIG. 7, a resin molding part 600 is formed by molding protection circuit board 500 with a melting resin. More particularly, resin molding part 600 is formed by putting protection circuit board 500 in a mold (not shown) and molding protection circuit board 500 with a melting resin. Alternatively, resin molding part 600 may be formed by putting can 200 receiving an electrode assembly (not shown), of which the end is closed with a cap assembly (not shown), protection circuit board 500 and lid electrode part (not shown) in a mold and molding them with a melting resin. Herein, the terminal surface of a charge-and-discharge terminal 540 may be molded with a melting resin so as to be exposed to the outside.

Also, resin molding part 600 may be formed in such a manner that the terminal surface of test terminal 550 is exposed. Herein, test terminal 550, of which the terminal surface is electrically connected to a voltage meter (not shown), determines whether or not protection circuit board 500 works normally by a measured voltage. Since the number of electric contact of the terminal surface of test terminal 550 to a voltage meter (not shown) is not many, it is possible to form an electroless plated layer having a short process time on the terminal surface of test terminal 550.

The technical idea of the present invention is not confined to the aforementioned descriptions regarding embodiments or drawings. Without departing from the gist of the present invention, anyone those skilled in the art can practice various changes and modifications which are described in the claims of the present invention.

The protection circuit board for a secondary battery of the present invention can prevent static electricity from being introduced into a protection circuit board by forming an electroless plated layer on the terminal surface of a test terminal.

Furthermore, in the present invention, the fabrication time of a protection circuit board can be reduced as much as 6 hours or more by forming the terminal surface of a test terminal with an electroless plated layer.

Furthermore, in the present invention, the fabrication cost of a protection circuit board can be reduced by forming the terminal surface of a test terminal with an electroless plated layer.

Furthermore, the material of an electroless plated layer to be formed on a test terminal is selective in order to improve the elegance and luster of a test terminal.

What is claimed is:

1. A secondary battery, comprising:
an electrode assembly comprising an anode plate electrically connected to an anode tap, a cathode plate electrically connected to a cathode tap and a separator interposed between the anode plate and the cathode plate;
a can receiving the electrode assembly, with one end part of the can being open;
a cap assembly comprising an electrode terminal electrically connected to the cathode tap and a cap plate electrically connected to the anode tap;
a lid electrode part electrically connected to the electrode terminal and the cap plate;
a protection circuit board comprising:
   an insulation substrate;
   a printed circuit board pattern formed on the insulation substrate and electrically connected to the lid electrode part;
   a protection circuit part electrically connected to the printed circuit board pattern;
   a charge-and-discharge terminal formed on the insulation substrate and electrically connected to the printed circuit board pattern and the protection circuit part; and
   a test terminal formed on the insulation substrate and electrically connected to the printed circuit board pattern and the protection circuit part, with the test terminal comprising an electroless plated layer formed on the test terminal.

2. The secondary battery as claimed in claim 1, comprised of a resin molding part formed by molding the protection circuit board with a melting resin so as to expose the surface of the charge-and-discharge terminal.

3. The secondary battery as claimed in claim 2, comprised of the resin molding part being formed in such a manner that the terminal surface of the test terminal is exposed.

4. The secondary battery as claimed in claim 3, comprised of the electroless plated layer being made from Au.

5. The secondary battery as claimed in claim 3, comprised of the electroless plated layer being made from Ag.

6. The secondary battery as claimed in claim 3, comprised of the electroless plated layer being made from Ni.

7. The secondary battery as claimed in claim 3, comprised of the electroless plated layer being made from an alloy of Ni and P.

8. The secondary battery as claimed in claim 3, further comprising a second electroless plated layer formed on the electroless plated layer.

9. The secondary battery as claimed in claim 8, comprised of the second electroless plated layer being made from Au.

10. The secondary battery as claimed in claim 8, comprised of the second electroless plated layer being made from one selected from a group consisting essentially of Ni, Ag, and an alloy of Ni and P.

* * * * *